(12) United States Patent
Chang et al.

(10) Patent No.: US 7,674,986 B2
(45) Date of Patent: Mar. 9, 2010

(54) CIRCUIT BOARD STRUCTURE HAVING CAPACITOR ARRAY AND EMBEDDED ELECTRONIC COMPONENT AND METHOD FOR FABRICATING THE SAME

(75) Inventors: Chia-Wei Chang, Hsin-chu (TW); Chung-Cheng Lien, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 804 days.

(21) Appl. No.: 11/537,417

(22) Filed: Sep. 29, 2006

(65) Prior Publication Data
US 2007/0147014 A1    Jun. 28, 2007

(30) Foreign Application Priority Data
Dec. 22, 2005    (TW) ............................. 94145810 A

(51) Int. Cl.
*H05K 1/16*    (2006.01)
(52) U.S. Cl. ...................................... 174/260; 361/761

(58) Field of Classification Search ......... 361/761–764; 174/260
See application file for complete search history.

(56) References Cited

U.S. PATENT DOCUMENTS 7,038,143 B2 *    5/2006    Utsumi et al. ............... 174/258

\* cited by examiner

*Primary Examiner*—Jeremy C Norris
(74) *Attorney, Agent, or Firm*—Foley & Lardner LLP

(57) ABSTRACT

A circuit board structure having a capacitor array and an embedded electronic component and a method for fabricating the same are proposed. Two carrier boards and a high dielectric constant material layer are provided, wherein the carrier boards have electronic components embedded therein and one surface of each carrier board has a plurality of electrode plates. The two carrier boards are laminated with the dielectric constant material layer interposed between them. The electrode plates on the surfaces of the carrier boards are opposite to each other across the high dielectric constant material layer to constitute a capacitor array. Therefore, the capacitor assembly for design of electronic devices is provided.

14 Claims, 5 Drawing Sheets

CIRCUIT BOARD STRUCTURE HAVING CAPACITOR ARRAY AND EMBEDDED ELECTRONIC COMPONENT AND METHOD FOR FABRICATING THE SAME

FIELD OF THE INVENTION

The present invention relates to circuit boards having capacitor arrays and embedded electronic components, and methods of making the same, and more particularly to a circuit board having a capacitor array formed by laminating carrier boards having embedded electronic components and electrode plates having capacitors on one surface of the carrier board and a method of making the same.

BACKGROUND OF THE INVENTION

Due to the rapid growth in the electronic industry, electronic devices have gradually been developed towards the direction of multi-function, high speed and low-profile, and as a result reducing surface area of circuit board and miniaturization of the package are the two primary targets in the electronic industry. In the demand of high integration and miniaturization of semiconductor packages, many have adopted a multi-chip module (MCM) with multi-layer board using the technology of interlayer connection so as to increase the usable surface area of the circuit bard in order to meet the demand of high integrated circuit.

However as semiconductor devices become more highly integrated and with increased multi-layers, electronic components within the multi-chip module are also increased in number. In the condition where the number of leads and circuit complexity are increased but the circuit volume is decreased, the noise accompanying with it is also increases. This is usually solved by providing passive components such as resistor, inductance, and capacitor in the semiconductor package for reducing noise, stabilizing circuits as well as increasing electronic functionality.

Conventionally, these passive components are mounted on the surface of the circuit board where it is not occupied by the semiconductor chip using a surface mounting technology (SMT). However this method requires a relative larger surface area of the circuit board, thereby making it difficult to reduce the overall size of the semiconductor package. Moreover these passive components are often mounted into different regions of the circuit board, thereby increasing the difficulty of disposing circuit and the complexity of fabricating process.

As shown in FIG. 1, a plurality of passive components 12 are mounted on one surface of the circuit board 1. The circuit board can be a printed circuit board or a substrate. In order to prevent the passive components to hinder the connection between the semiconductor chip and the circuit board, conventionally the passive components 12 are mounted at the edge or corner of the circuit board 1 or the places where the semiconductor chip would not be interfered. This type of arrangement although increases the circuit disposing area but the effectiveness of eliminating noise and stabilizing circuit is decreased accordingly. Moreover, as the semiconductor device is developed toward high functionality, the number of passive components 12 in the package is increased accordingly, therefore using conventional method, the volume of semiconductor package would be increased so as to accommodate semiconductor chips 11 and large number of passive components 12, thereby making it not possible to meet the requirement of low-profile package.

In addition, as the semiconductor device is developed towards the direction of more multi-functions, higher operational speed, and reduced volume, multi-layer circuit board must be developed with low-profile, increased multi-layers, high circuit layout density and low noise level. As a result, in order to further reduce the volume of circuit board, a multi-layer circuit board with embedded passive components is developed by stacking the passive components between each multi-layered circuit board in a film-like manner. The material and method of forming passive components within the multi-layered stacking circuit board has been one of major focuses in the industry. Generally, prior to forming a new layer, a material forming passive components are formed on the dielectric layer, then the process of printing and photolithography is followed to define the shape, resistance and capacitance of the passive components. Then the dielectric layer is laminated and a circuit patterning is performed to form a circuit layer so as to electrically connect the embedded passive components and other electronic components.

Although the technology of forming embedded film-like passive components between each layers of the multi-layered circuit board can solve the problem of limitation of available circuit disposing area in the prior art, the fabricating process of forming embedded passive components between each layers of the multi-layered circuit board is complex and moreover because of the large difference of coefficient of thermal expansion (CTE) between the dielectric layer and embedded passive components, a peeling issue is often involved in the fabricating process.

Accordingly, there is an urgent need to develop a semiconductor package in which the prior art problems are solved and is low-profiled and able to accommodate sufficient number of capacitor passive components in a single unit, so as to improve the functionality of the electronic device.

SUMMARY OF THE INVENTION

In the view of prior art drawbacks, a primary objective of the present invention is to provide a circuit board having a capacitor array and embedded electronic components and a method of fabricating the same, so as to form the circuit board having a capacitor array by laminated with high dielectric constant material.

Another objective of the invention is to provide a circuit board having a capacitor array and embedded electronic components and a method of fabricating the same, in which electronic components are embedded in the circuit board, so that the prior art problems of complexity in disposing circuit due to the electronic elements mounted on the surface and insufficient disposing space are solved.

Still another objective of the invention is to provide a circuit board having a capacitor array and embedded electronic components and a method of fabricating the same, in which the capacitor components are formed in a simple fabricating method, so that the prior art problems of complexity in disposing circuit due to the electronic elements mounted on the surface and insufficient disposing space are solved.

A further objective of the invention is to provide a circuit board having a capacitor array and embedded electronic components and a method of fabricating the same, in which the capacitor components are formed in a simple fabricating method so as to prevent complexity in fabrication due to the process of embedding passive components between circuit board layers.

In order to achieve the foregoing and other objectives, the present invention proposes a method of forming a circuit board having a capacitor array and embedded electronic components, comprising the steps of: proving two carrier boards and a high dielectric constant material layer, in which the carrier boards have embedded electronic components therein and a plurality of electrode plates on one surface of the carrier boards; laminating the carrier boards having high dielectric constant material layer interposed in between in a way that the electrode plates on the surface of one carrier board are facing towards the electrode plates on the other carrier board separated by the high dielectric constant material layer, so as to form a capacitor array.

The other surface of the carrier board is formed with a circuit build-up structure, which is electrically conductive to the electronic components and electrode plates.

Furthermore, the foregoing fabricating method comprises a step of forming a plurality of plated through holes in the carrier boards, high dielectric material layer, and circuit build-up structure for providing electrical connections between the carrier boards and the circuit build-up structure.

Through the foregoing fabricating method, the present invention discloses a circuit board having a capacitor array and embedded electronic components, comprising: a high dielectric constant material layer; and carrier boards formed on the top and bottom surface of the high dielectric constant material layer, in which a plurality of electrode plates are formed on one surface thereof, and the electrode plates on one carrier board are facing towards the electrode plates on the other carrier board, separated by the high dielectric constant material layer, so as to form a capacitor array.

Furthermore, a plurality of conductive structures electrically conductive to the electrode plates are formed in the carrier board and a circuit build-up structure electrically conductive to the electronic components and electrode plates is formed on the other surface of the carrier board.

Besides, the foregoing circuit board further comprises a plurality of plated through holes penetrating the carrier board, high dielectric constant material and circuit build-up structure allowing the carrier board to be electrically conductive to the circuit build-up structure.

Accordingly, a circuit board having a capacitor array and embedded electronic components and the method of making the same proposed by the present invention involves direct laminating the two circuit boards having electrode plates and embedded electronic components with a high dielectric constant material interposed in between, in which a capacitor array is formed in the circuit board by a high dielectric constant material interposed between the two carrier boards and the opposing electrode plates. Moreover, conductive structures such as conductive vias and plated through holes are formed in the carrier boards to act as positive/negative electrodes for electrically conductive the capacitors to the other capacitors in parallel or in serial selectively according to practical needs.

As such, the circuit board having a capacitor array and embedded electronic components and the method of making the same proposed by the invention permits the development of low-profile circuit board, as well as eliminating the requirement of surface mounting technology (SMT)) for forming passive components on the surface of the circuit board, thereby solving the prior art problem of limited space for disposing circuit on the circuit board, as well as simplifying fabricating procedure by eliminating the complicated process of embedding passive components in a multi-layered circuit board. Moreover, peeling issue resulted from the large difference of coefficient of thermal expansion (CTE) between the dielectric layer and embedded passive components in the prior art can be solved.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Figure 1:
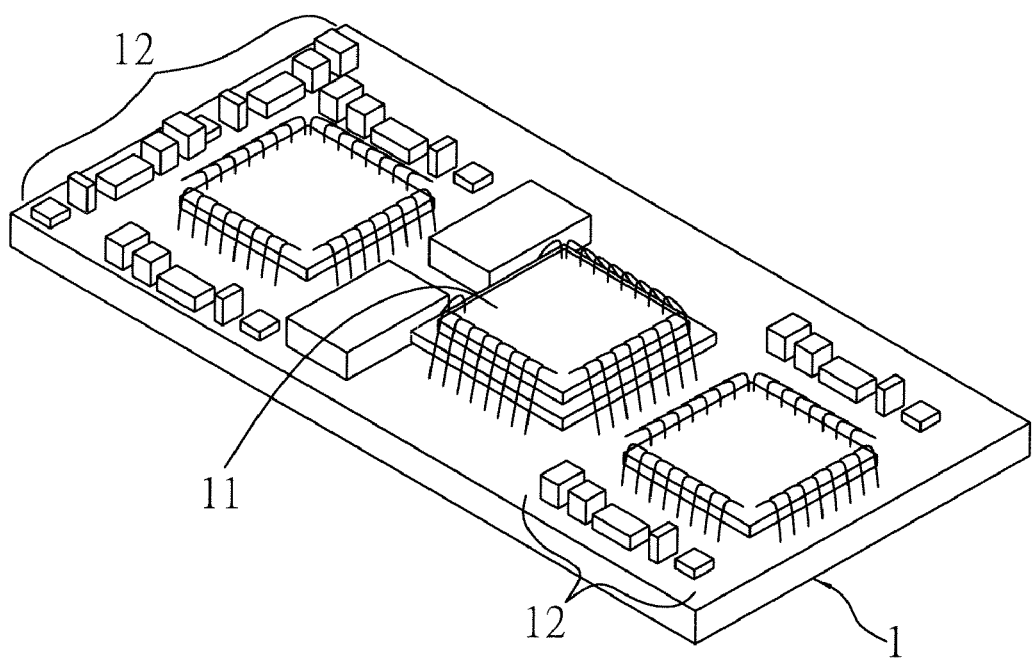
FIG. 1 (PRIOR ART) is a schematic diagram showing a passive component being disposed in a region outside the chip-mounting region on the circuit board in a prior art.

The present invention is described in the following with specific embodiments, so that one skilled in the pertinent art can easily understand other advantages and effects of the present invention from the disclosure of the invention. The present invention may also be implemented and applied according to other embodiments, and the details may be modified based on different views and applications without departing from the spirit of the invention. In addition, the drawing and the components shown herein are not to scale and are made in simplicity with provision of only associated components related to the invention; in practical usage, the component should e more complexly structured and the number, size, shape and arrangement of each component can be varied accordingly.

Figure 2A:
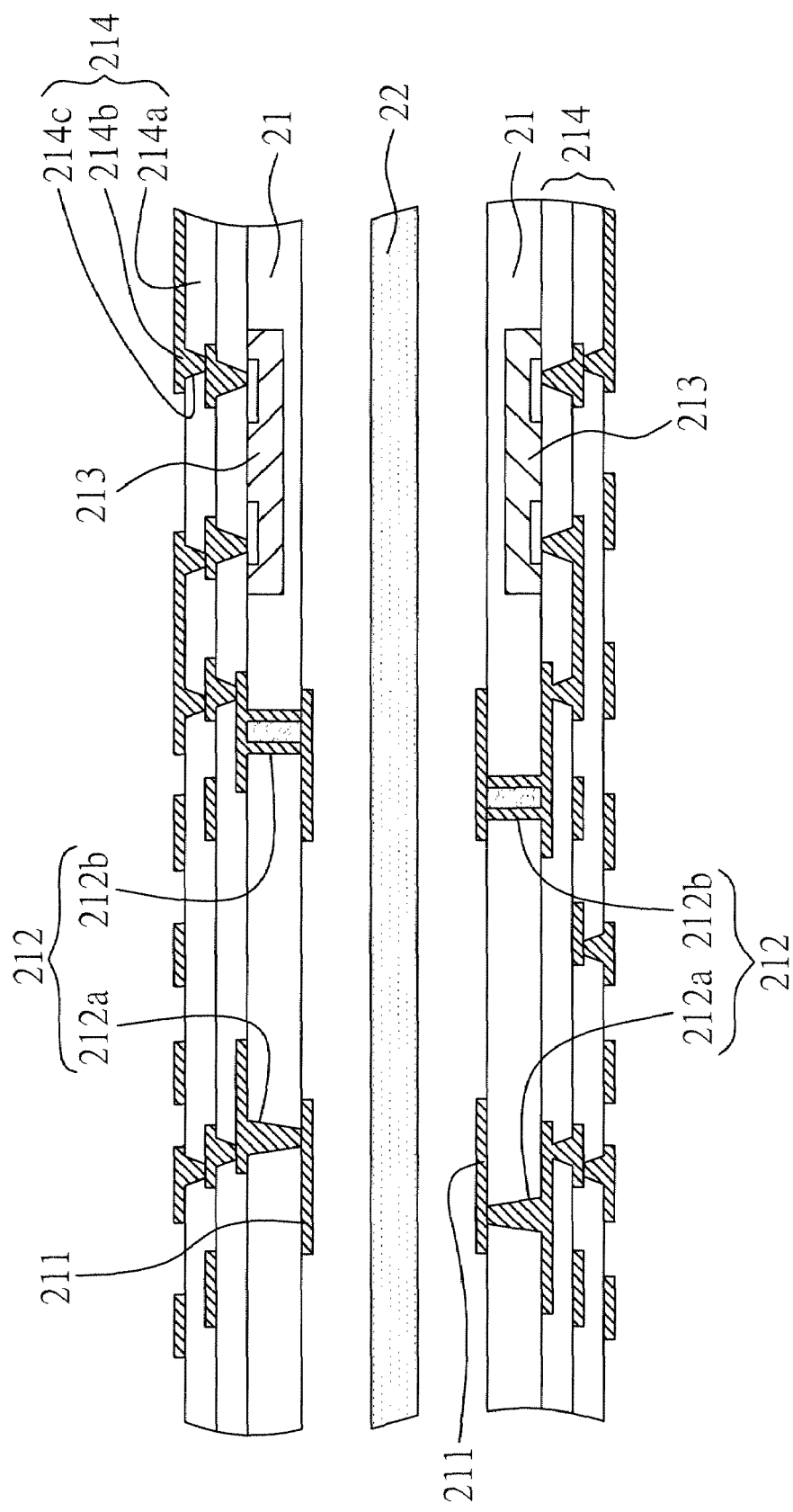
FIGS. 2A and 2B are schematic cross-sectional views showing a method of forming a circuit board having a capacitor array and embedded electronic components of the present invention.
Figure 2B:
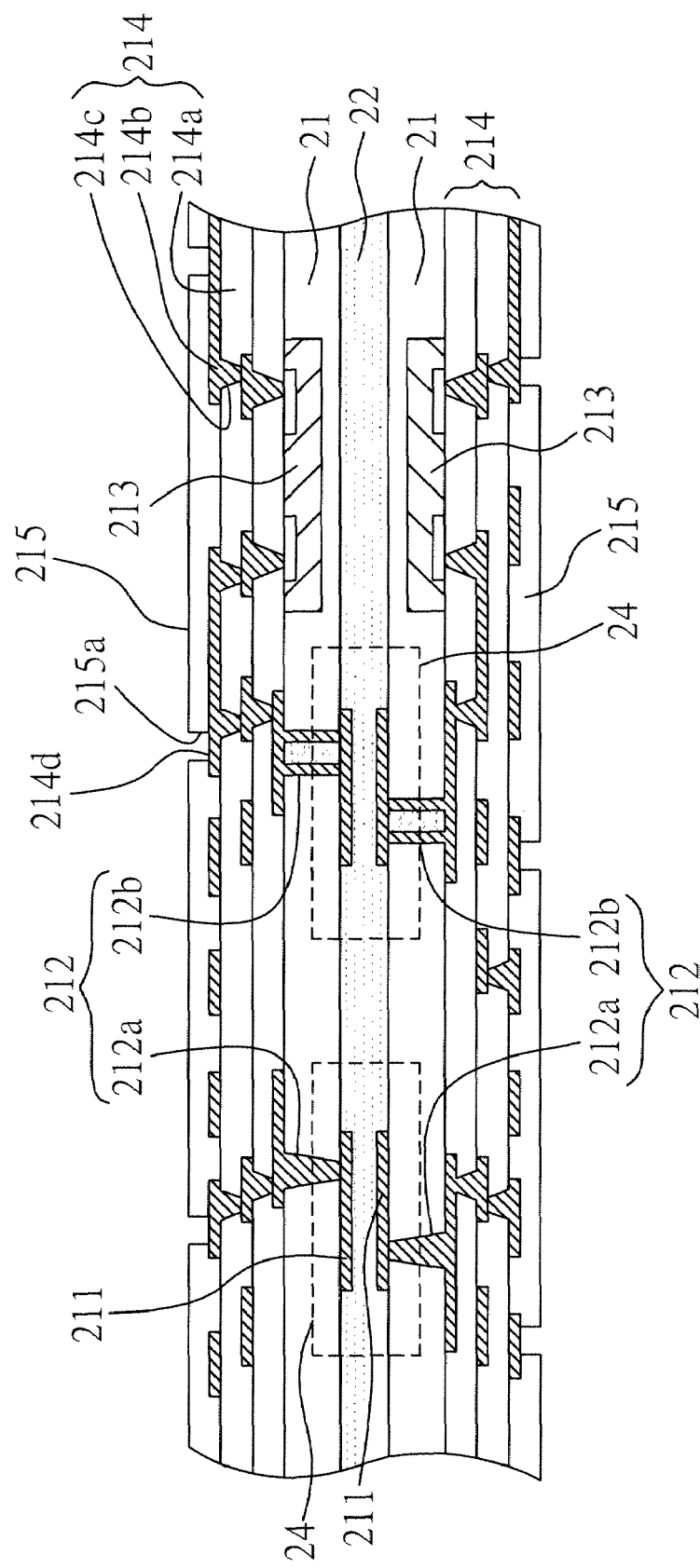

Referring to FIGS. 2A and 2B, a schematic cross-sectional view showing a method of fabricating a circuit board having a capacitor array and embedded electronic components of the present invention are provided.

As shown in FIG. 2A, firstly two carrier boards 21 and a high dielectric constant material layer 22 are provided, wherein the carrier board 21 has embedded electronic components 213 (such as active components or passive components) therein, electrode plates 211 on one surface of the carrier board 21 and circuit build-up structure 214 on the other surface thereof. The electrode plates 211 are electrically conductive to the circuit build-up layer 214 via conductive structures 212 such as conductive vias 212a or plated through holes 212b so as to extend electrical connection to the electronic components 213. The circuit build-up structure 214 further comprises dielectric layers 214a, circuit layers 214b overlaid on top of the dielectric layers 214a and conductive structures 214c interposed between the dielectric layers.

As shown in FIG. 2B, the two carrier boards 21 having a high dielectric constant material layer 22 between the two are laminated in a way that the electrode plates 211 on the surface of one carrier board 21 are facing towards the electrode plates 211 on the other carrier board 21 separated by the high dielectric constant material layer 22, so as to form an array consisting of a plurality of capacitors. The material for forming the above-mentioned high dielectric constant material layer is selected from a material having high dielectric constant such as a polymer, ceramic material, ceramic filled polymer or similar material which are formed by mixing one of the compound: Barium-titanate, lead-zirconate-titanate and amorphous hydrogenated carbon in a binder. The binder is formed by sputtering, printing or roller spinning and made of a material such as resin, powdered glass. The capacitors 24 can use the conductive structures such as conductive vias and plated through holes as positive/negative electrodes for electrically conductive to the other capacitors in parallel or in serial selectively according to practical needs. On the surface of the circuit build-up structure 214, an insulating protection layer 215 is formed with openings 215a for exposing the electrically conductive pads 214d of the outer most circuit layer of the circuit build-up structure 214.

Through the foregoing fabricating method, a circuit board having a capacitor array and embedded electronic components of the present invention comprising: a high dielectric constant material layer 22; and carrier boards 21 formed on the top and bottom surface of the high dielectric constant material layer 22, in a plurality of electrode plates 211 are formed on one surface thereof, and the electrode plates 211 on one carrier board 21 are facing towards the electrode plates 211 on the other carrier board 21 separated by the high dielectric constant material layer 22, so as to form a capacitor array. The carrier board 21 has electronic components 213 (such as active components or passive components) embedded therein and circuit build-up structure 214 electrically conductive to the electronic components 213, so as to extend the electrical connections of the electronic components 213.

Figure 3:
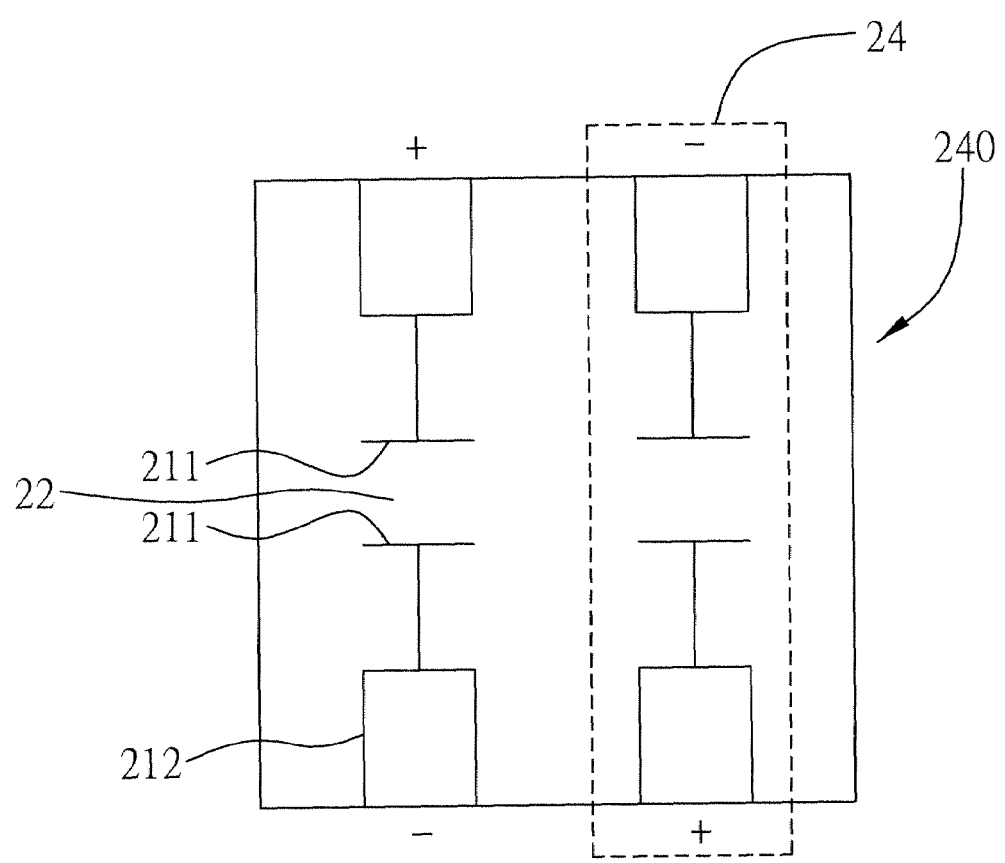
FIG. 3 is a schematic diagram showing a capacitor array in the circuit board having a capacitor array and embedded electronic components of the invention.

Referring to FIG. 3, a schematic view showing a circuit board having a capacitor array and embedded electronic components of the invention is provided. As shown in the drawing, the capacitor array 240 consisting of a plurality of capacitors 24 is formed as a plurality of opposing electrode plates with a high dielectric constant material layer 23 interposed between the opposing electrode plates. The capacitors 24 can use the conductive structures such as conductive vias and plated through holes as positive/negative electrodes for electrically conductive to the other capacitors in parallel or in serial selectively according to practical needs.

Figure 4:
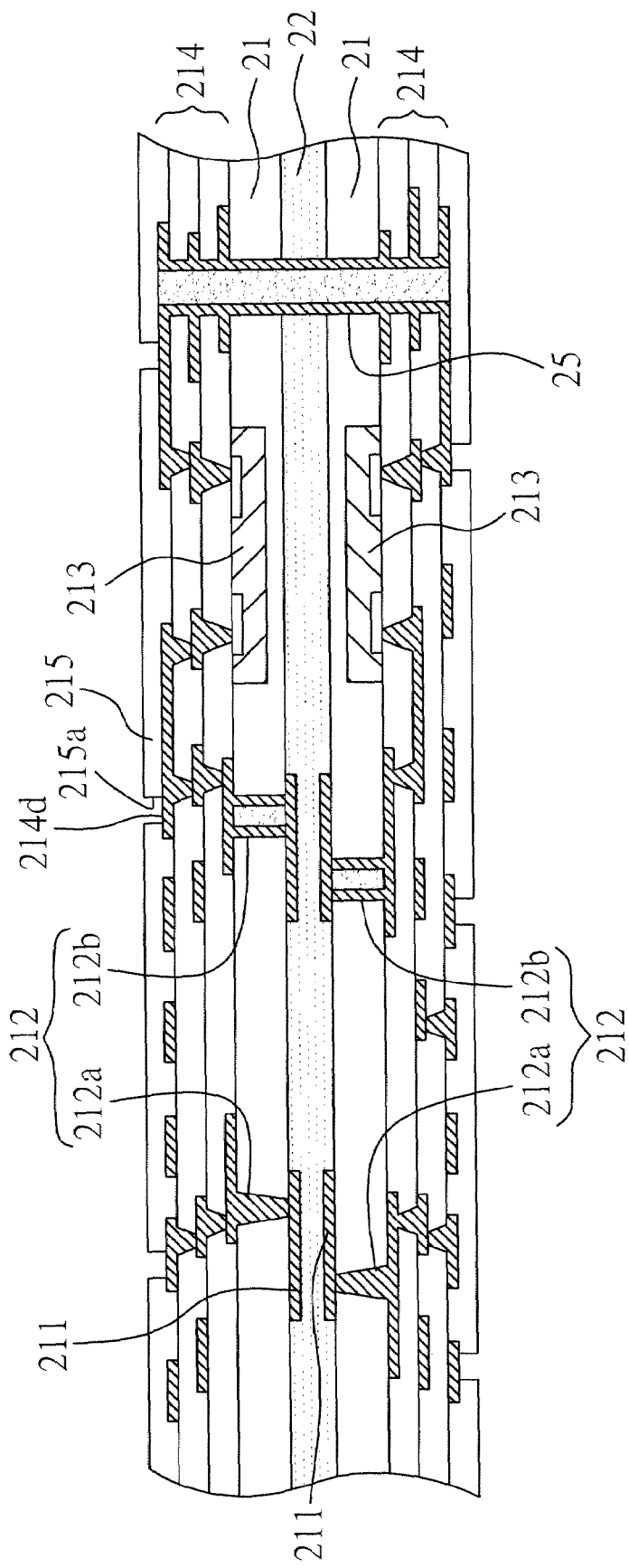
FIG. 4 is a schematic cross-sectional view showing a circuit board having a capacitor array and embedded electronic components in accordance with another preferred embodiment of the invention.

Referring to FIG. 4, a schematic cross-sectional view of a circuit board having a capacitor array and embedded electronic components of another preferred embodiment of the invention is provided. As shown in the drawing, in the present embodiment, the circuit board structure comprises a high dielectric constant material layer 22 and carrier boards formed on the top and bottom surface o the high dielectric constant material layer 22, a circuit build-up structure 214 and electrode plates 211 formed respectively on the two surfaces of the carrier board 21, and conductive structures 21 formed between each circuit layer for providing electrical connections between the circuit build-up structure 214 and the electrode plates 211. The electrode plates 211 on one carrier board are facing towards the electrode plates 211 on the other carrier board 21 separated by the high dielectric constant material layer 22, so as to form a capacitor array.

Moreover, a plurality of plated through holes 25 penetrating through each circuit layer are formed in the carrier boards 21, high dielectric constant material layer 22 and circuit build-up structure 214 for providing electrical connections between he circuit build-up structure 214 and the electrode plates.

Accordingly, a circuit board having a capacitor array and embedded electronic components and the method of making the same proposed by the present invention involves a direct laminating the two circuit boards having electrode plates and embedded electronic components with a high dielectric constant material interposed in between, in which a capacitor array is formed in the circuit board by a high dielectric constant material interposed between the two carrier boards and the opposing electrode plates. Moreover, conductive structures such as conductive vias and plated through holes are formed in the carrier boards to act as positive/negative electrodes for electrically conductive the capacitors to the other capacitors in parallel or in serial selectively according to practical needs. In addition, the electronic components embedded in the carrier boards can operate in coordination to increase the electronic functionality. As such, it is of advantageous that low-profile circuit board can be designed and the process of surface mounting technology (SMT) for forming passive components on the surface of the circuit board can be eliminated, thereby solving the prior art problem of limited space for disposing circuit on the circuit board, as well as simplifying fabricating procedure by eliminating the complicated process of embedding film-like capacitor passive components in a multi-layered circuit board. Moreover, peeling issue resulted from the large difference of coefficient of thermal expansion (CTE) between the dielectric layer and embedded passive components in the prior art can be solved.

In the foreign drawings, only part of the capacitors and capacitor array are shown therein, the numbers and positions of capacitors, capacitor arrays and circuit layers in the circuit board are variable according to practical needs. The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method of forming a circuit board having a capacitor array and embedded electronic components, comprising the steps of:

providing two carrier boards and a high dielectric constant material layer, in which the carrier boards have the embedded electronic components therein and a plurality of electrode plates on one surface of each of the carrier boards;

forming a circuit build-up structure on the other surface of each of the carrier boards, wherein the circuit build-up structure comprises dielectric layers, circuit layers formed on the dielectric layers and conductive structures formed in the dielectric layers, allowing the conductive structures of the circuit build-up structure to be electrically conductive to the electronic components and the electrode plates of the carrier boards, and wherein an outermost surface of the circuit build-up structure has electrically conductive pads formed thereon; and laminating the carrier boards with the high dielectric constant material layer interposed therebetween in a way that the carrier boards are separated by the high dielectric constant material layer and the electrode plates on the surface of one carrier board are facing towards the electrode plates on the other carrier board, so as to form the capacitor array.

2. The method of forming a circuit board having a capacitor array and embedded electronic components of claim 1 further comprising forming an insulating protection layer on the surface of the circuit build-up structure, wherein the insulating protection layer has openings to expose the electrically conductive pads thereto.

3. The method of forming a circuit board having a capacitor array and embedded electronic components of claim 1 further comprising forming a plurality of plated through holes in the carrier boards, high dielectric constant material layers and circuit build-up structure allowing the carrier boards to be electrically conductive to the circuit build-up structure.

4. The method of forming a circuit board having a capacitor array and embedded electronic components of claim 1, wherein the electrode plates are electrically conductive to each other by the conductive structures in the carrier boards.

5. The method of forming a circuit board having a capacitor array and embedded electronic components of claim 4, wherein the conductive structures are conductive vias or plated through holes.

6. The method of forming a circuit board having a capacitor array and embedded electronic components of claim 4, wherein the conductive structures act as positive/negative electrodes of the capacitors, allowing the capacitors to be electrically conductive to each other in parallel or in series.

7. The method of forming a circuit board having a capacitor array and embedded electronic components of claim 1, wherein the high dielectric constant material is selected from a material selected from a group comprising polymer, ceramic material, ceramic filled polymer or similar material.

8. A circuit board having a capacitor array and embedded electronic components, comprising:
a high dielectric constant material layer; and
carrier boards formed on top and bottom surfaces of the high dielectric constant material layer, in which the electronic components are embedded in the carrier boards, and a plurality of electrode plates are formed on one surface of each of the carrier boards, and a circuit build-up structure is formed on the other surface of each of the carrier boards, wherein the circuit build-up structure comprises dielectric layers, circuit layers formed on the dielectric layers, and conductive structures formed in the dielectric layers, allowing the conductive structures of the circuit build-up structure to be electrically conductive to the electronic components and the electrode plates of the carrier boards, and an outermost surface of the circuit build-up structure has electrically conductive pads and the electrode plates on one carrier board are facing towards the electrode plates on the other carrier board separated by the high dielectric constant material layer, so as to form the capacitor array.

9. The circuit board having a capacitor array and embedded electronic components of claim 8 further comprising forming an insulating protection layer on the surface of the circuit build-up structure, wherein the insulating protection layer has openings to expose the electrically conductive pads thereto.

10. The circuit board having a capacitor array and embedded electronic components of claim 8 further comprising forming a plurality of plated through holes in the carrier boards, high dielectric constant material layers and circuit build-up structure allowing the carrier boards to be electrically conductive to the circuit build-up structure.

11. The circuit board having a capacitor array and embedded electronic components of claim 8, wherein the electrode plates are electrically conductive to each other by the conductive structures in the carrier boards.

12. The circuit board having a capacitor array and embedded electronic components of claim 11, wherein the conductive structures are conductive vias or plated through holes.

13. The circuit board having a capacitor array and embedded electronic components of claim 11, wherein the conductive structures act as positive/negative electrodes of the capacitors, allowing the capacitors to be electrically conductive to each other in parallel or in series.

14. The circuit board having a capacitor array and embedded electronic components of claim 8, wherein the high dielectric constant material is selected from a material selected from a group comprising polymer, ceramic material, ceramic filled polymer or similar material.

* * * * *